US006387575B2

(12) United States Patent
Chen et al.

(10) Patent No.: US 6,387,575 B2
(45) Date of Patent: May 14, 2002

(54) REDIRECTING OPTICAL MASK FOR CREATING RE-ENTRANT NOZZLES

(75) Inventors: Chien-Hua Chen; Michael A Pate, both of Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/865,986

(22) Filed: May 25, 2001

Related U.S. Application Data

(62) Division of application No. 09/243,650, filed on Feb. 1, 1999, now Pat. No. 6,261,742.

(51) Int. Cl.[7] ................................ G03F 9/00; B41J 2/14
(52) U.S. Cl. ................................ 430/5; 347/47
(58) Field of Search ................................ 430/5; 347/47

(56) References Cited

U.S. PATENT DOCUMENTS

| | | | | |
|---|---|---|---|---|
| 4,558,333 | A | 12/1985 | Sugitani et al. | 346/140 R |
| 4,780,177 | A | 10/1988 | Wojnarowski et al. | 156/643 |
| 4,786,358 | A | 11/1988 | Yamazaki et al. | 156/643 |
| 4,940,881 | A | 7/1990 | Sheets | 219/121.69 |
| 5,157,420 | A | 10/1992 | Naka et al. | 346/140 R |
| 5,208,980 | A | 5/1993 | Hayes | 28/890.1 |
| 5,312,517 | A | 5/1994 | Ouki | 156/643 |
| 5,378,137 | A | 1/1995 | Asakawa et al. | 425/174.4 |
| 5,417,897 | A | 5/1995 | Asakawa et al. | 264/22 |
| 5,539,175 | A | 7/1996 | Smith et al. | 219/121.7 |
| 5,548,894 | A | 8/1996 | Muto | 29/890.1 |
| 5,633,664 | A | 5/1997 | Bayat | 347/47 |
| 6,089,698 | A | 7/2000 | Temple et al. | 3347/47 |
| 6,303,900 | B1 * | 10/2001 | Tachikawa | 219/121.7 |

FOREIGN PATENT DOCUMENTS

| | | |
|---|---|---|
| EP | 367541 B1 | 10/1994 |
| JP | 5-330064 | 12/1993 |
| JP | 7-284975 | 10/1995 |
| JP | 9-207343 | * 8/1997 |

* cited by examiner

*Primary Examiner*—John A. McPherson
(74) *Attorney, Agent, or Firm*—Timothy F. Myers

(57) ABSTRACT

A method for manufacturing ink-jet printheads having nozzles with re-entrant profiles has the following steps. A source of electromagnetic energy is created which is then used with an optical system to produce a source of energy having a constant illumination angle on an process plane. A substrate is then exposed with the electromagnetic source to define the nozzles having the re-entrant profile. Also, apparatus for creating the constant illumination angle include an optical deflecting mask and an afocal optical system.

8 Claims, 11 Drawing Sheets

Refraction

Diffraction

REDIRECTING OPTICAL MASK FOR CREATING RE-ENTRANT NOZZLES

CROSS REFERENCE TO RELATED APPLICATIONS

This is a divisional of application Ser. No. 09/243,650 filed on Feb. 1, 1999, now U.S. Pat. Ser. No. 6,261,742.

FIELD OF THE INVENTION

The present invention relates to methods and apparatus of manufacturing ink-jet printheads, and in particular to the formation of re-entrant nozzles through which ink is discharged from the printhead.

BACKGROUND OF THE INVENTION

Thermal ink-jet printers operate by rapidly heating a small volume of ink and causing the ink to vaporize into a bubble which ejects a droplet of ink through an orifice nozzle to strike a recording medium, such as a sheet of paper. Typically, a number of orifices are arranged in a pattern upon a printhead. Thus, a properly sequenced ejection of ink from each orifice causes characters or other images to be printed upon the paper as the printhead is moved relative to the paper. In this print method, a major component of print quality depends upon the physical characteristics of the orifices in the printhead. For example, the geometry of the orifice affects the size, shape, trajectory, and speed of the ink drop ejected.

An ideal printhead includes nozzle members having re-entrant orifice nozzle profiles. Affixed to a back surface of the nozzle members is a substrate, which channels liquid ink into a vaporization chamber. Liquid ink within the vaporization chamber is vaporized by the energization of a thin film resistor formed on the surface of the substrate that causes a droplet of ink to be ejected from the orifice nozzle. Preferably, nozzle members are formed of a polymer material or a photoresist material using photolithography, laser ablation or other similar techniques to minimize cost and wafer process capability.

Re-entrant nozzles have many advantages over straight-bore or positive sloped nozzles. A re-entrant nozzle is a negatively sloped hole in an orifice layer. The re-entrant nozzle is a hole tapered to form a smaller channel at the orifice layer exit surface than on the substrate surface. This taper increases the velocity of an ejected ink droplet. In addition, the wider bottom opening in the nozzle allows for a greater alignment tolerance between the nozzle and the thin film resistor without affecting the quality of print. Additionally, a finer ink droplet is ejected, enabling printing that is more precise.

Re-entrant nozzles, in which the nozzle is part of a monolithic structure of polymer material on a substrate, are difficult to manufacture using conventional processes. Re-entrant nozzles have been formed using a laser by changing the angle of nozzle substrate with respect to a masked laser beam during the nozzle forming process. An improvement to this technique is to form the re-entrant nozzles with a laser by rotating and tilting an optical element between the laser and the nozzle substrate. Another re-entrant nozzle manufacturing technique is to use two or more masks for forming a single array of nozzles where each mask has a pattern corresponding to a different nozzle diameter. Still another re-entrant nozzle manufacturing technique is to defocus the laser beam during the orifice forming process.

Photolithography approaches have the opportunity to reduce the manufacturing time and reduce the complexity. Masks using projection printing have an opening corresponding to where a nozzle is formed in a photoresist layer. These masks have been used in the past for forming straight and single-angled re-entrant nozzles by controlling the fluence (joules/cm$^2$) of laser radiation at the target substrate. Another photolithography process uses a single mask to form re-entrant nozzles in a photoresist layer. The mask used is similar to that of projection printing but the opaque and clear portions are reversed. The tapering performed in this process is due to the opaque portions of the mask causing frustum shaped shadows through the photoresist layer corresponding to where nozzles are to be formed. After developing and etching the photoresist layer, the resulting nozzles have a frustum shape. All of the aforementioned various techniques are only able to create one re-entrant nozzle at a time and thus are considered either time consuming, complicated, or subject to error.

Accordingly, what is needed is a process that can form more than one nozzle, preferably an entire printhead array, in a time efficient and highly reliable method using polymer or polyimide materials with either photolithography or optical ablation technology.

SUMMARY

A method for manufacturing ink-jet printheads having nozzles with re-entrant profiles has the following steps. An electromagnetic source is used with an optical system to produce a source of energy having a constant illumination angle on a process plane. A substrate is then exposed with the electromagnetic source to define the nozzles having the re-entrant profile.

Apparatus capable of creating the constant illumination angle include a redirecting optical mask and an afocal optical system.

DETAILED DESCRIPTION OF THE PREFERRED AND ALTERNATE EMBODIMENTS

Figure 1A:
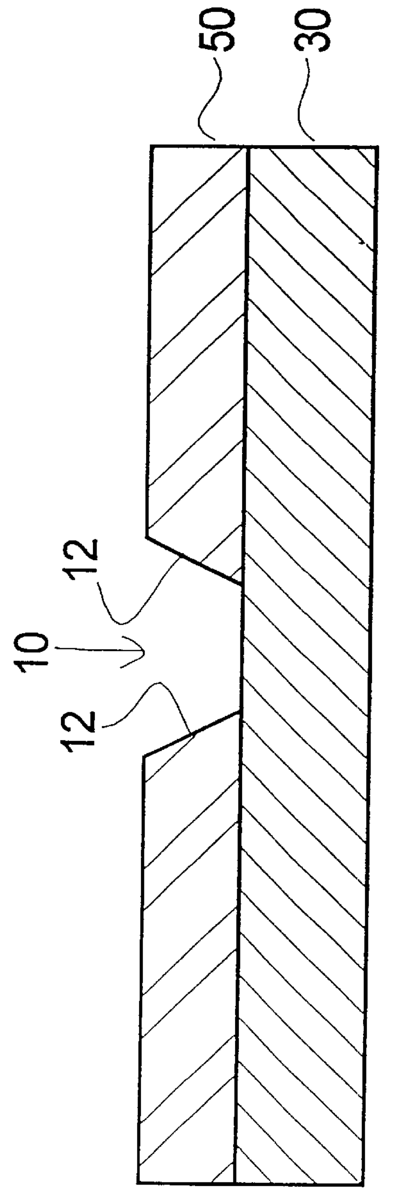
FIG. 1A illustrates a cross-sectional view of a conventional nozzle on a substrate.

FIG. 1A is a cross-section of a conventional etched nozzle 10 in a polyimide film 50 on a substrate 30 that has been exposed and developed. The nozzle 10 has positive sidewalls 12 that expand the nozzle from the top surface of the substrate 30 to the top surface of the polyimide film 50. This type of nozzle has the disadvantage in that when ink is ejected from it, the speed and direction of the ink are difficult to control.

Figure 1B:
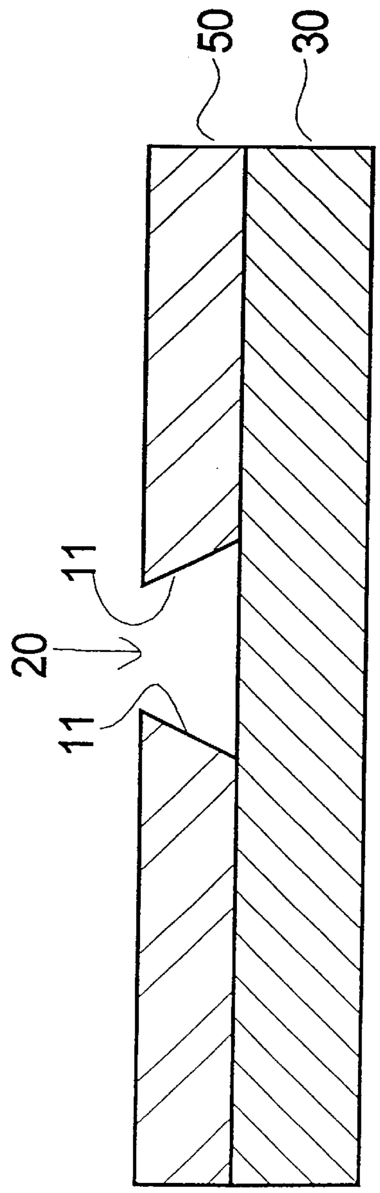
FIG. 1B illustrates a cross-sectional view of a re-entrant nozzle on a substrate.

FIG. 1B is a cross-section of a desirable type of re-entrant orifice or nozzle 20 required for high quality ink-jet printing. The polyimide film 50 on substrate 30 has negative sidewalls 11, which form the re-entrant nozzle 20. This re-entrant nozzle 20 is difficult to manufacture using conventional orifice manufacturing techniques for monolithic structures.

Figure 2A:
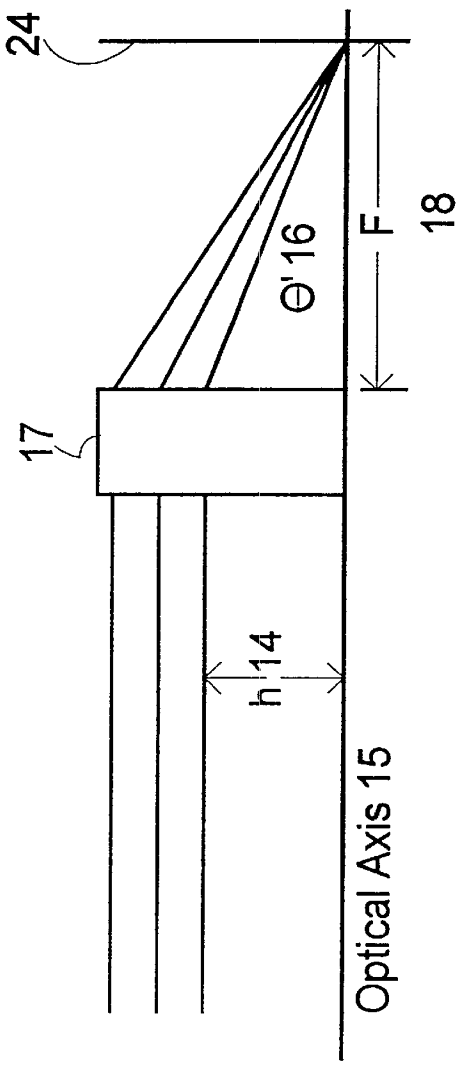
FIG. 2A illustrates the ray distribution of a conventional optical system.

FIG. 2A illustrates the properties of conventional optical systems. The conventional optical system 17 is shown about its optical axis 15. Electromagnetic energy, such as light, enters the conventional optical system 17 in a series of rays, each at a ray height 14, h, from the optical axis 15. The conventional optical system 17 then redirects and focuses the electromagnetic rays on an process plane 24 to a common focal point on the optical axis 15 at a distance F which is called the focal length 18 of the conventional optical system 17. The amount of deflection of the electromagnetic rays is represented by the angle of incidence 16, θ'. This angle of incidence 16 changes in a tangential relationship with the ray height 14. However, to make re-entrant nozzles that have uniform conical angles over the full printhead it is necessary to have a constant angle of incidence 16 over the full process plane of the optical system. This requirement is not possible to achieve with the conventional optical system 17 as its angle of incidence 16 varies with the ray height 14.

Figure 2B:
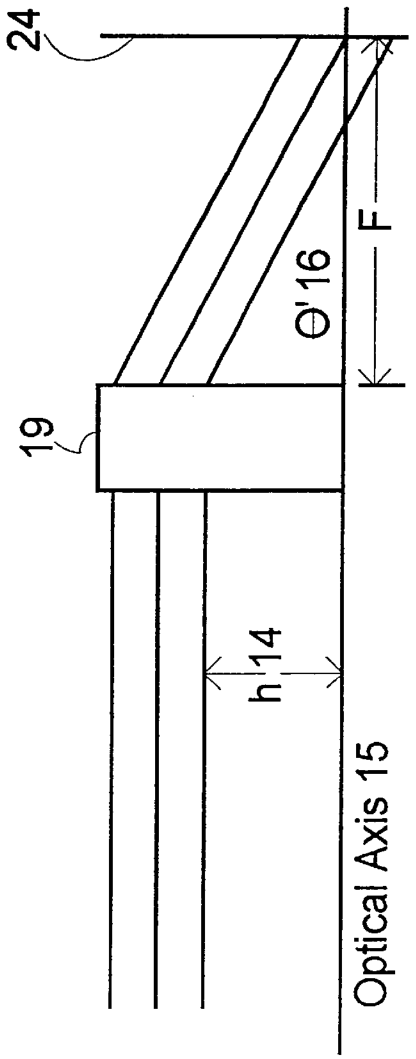
FIG. 2B illustrates the ray distribution of an afocal optical system.

FIG. 2B illustrates the properties of an afocal optical system 19, which has no one common focus point. This afocal optical system 19 has collimated rays entering it at a ray height 14 and the rays remain collimated upon exiting the afocal optical system 19. All of the rays exiting the afocal optical system 19 have the same angle of incidence 16 and do not converge to a common point on the process plane 24.

Figure 3:
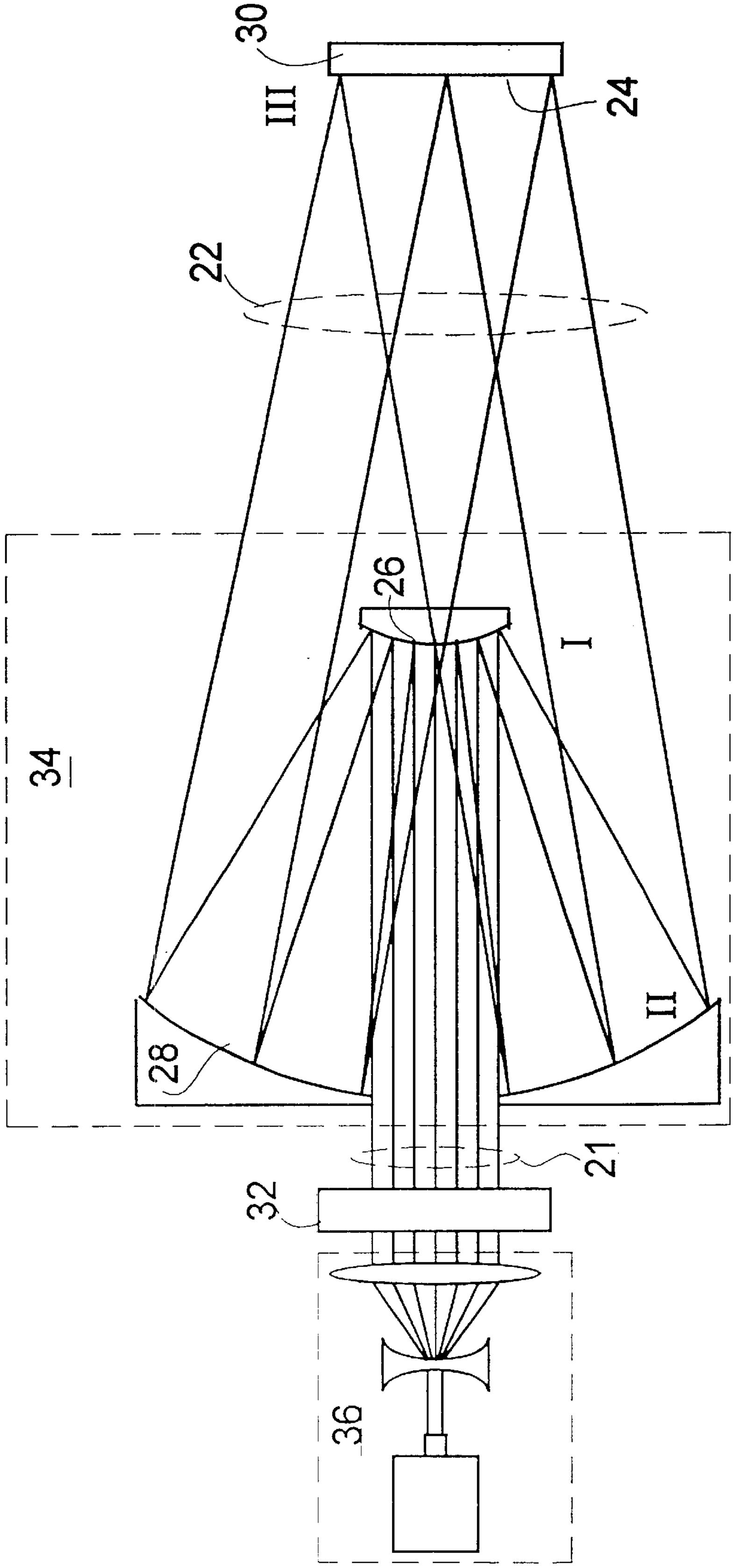
FIG. 3 illustrates an embodiment of the invention for creating the ray distribution of the type shown in FIG. 2B.

FIG. 3 illustrates a modified Schwartzchild reflective two mirror system 34 that is infinity corrected for both conjugates. The modified Schwartzchild reflective two mirror system 34 includes a radiation source 36, which may be white light, laser, an arc lamp, or other electromagnetic energy source, either coherent or non-coherent, extending from within the deep ultraviolet through the far infrared region. Some radiation sources 36 do not have a uniform intensity distribution from the optical axis to the edge of the beam. For example, a laser beam typically has a gaussian shaped intensity distribution. Non-uniform intensity distributions may be compensated or adjusted by applying a radially varying neutral density filter 32 on the radiation source 36 to create a source of illumination 21 which enters the modified Schwartzchild reflective two mirror system 34. The source of illumination 21 reflects off a first convex mirror 26, called a secondary mirror, onto a second concave mirror 28, call the primary mirror. The source of illumination 21 passes through the second mirror 28 before reaching the first mirror 26. This is performed by having an opening within the second mirror 28. The source of illumination 21 reflects off the second mirror 28 to create a constant illumination angle electromagnetic source 22. This electromagnetic source 22 strikes an process plane 24 on a substrate 30 with the rays having a constant angle of incidence. An exemplary design implementation having a source of illumination 21 with a beam of 10 mm in diameter and creating a 10.5 mm diameter beam on the process plane 24 is described by the following optical prescription (the surfaces are illustrated in FIG. 3):

| Surface | Radius | Thickness | Glass |
|---|---|---|---|
| | Infinity | Infinity | Air |
| | Infinity | 125 mm | Air |
| I | 25 mm | −100 mm | Mirror |
| II | 125 mm | 325 mm | Mirror |
| III | Infinity | Image | |

The design of the aspheric surface on the second mirror 28 is one of the keys to achieving the constant angle of incidence to form the constant angle of illumination with ray height. The aspheric surface is a general conic surface of a hyperboloid with a conic constant of K=−7. Those skilled in the art will appreciate that the conic constant may be changed to achieve a different distribution of radial aperture compression to even out the illumination uniformity at the process plane 24. This illumination uniformity may also be achieved by adjusting the obscuration ratio of the two mirrors to clip different radial zones. Those skilled in the art will appreciate that the mirror separation, radii, conic constant, and process distance can change with different optical designs and achieve the same result of a constant illumination angle with ray height and still meet the spirit and scope of the invention. In addition, there are other multiple mirror configurations that make this design possible, as well as refractive aspheric designs that could achieve the same results.

Figures 4A, 4B, 4C:
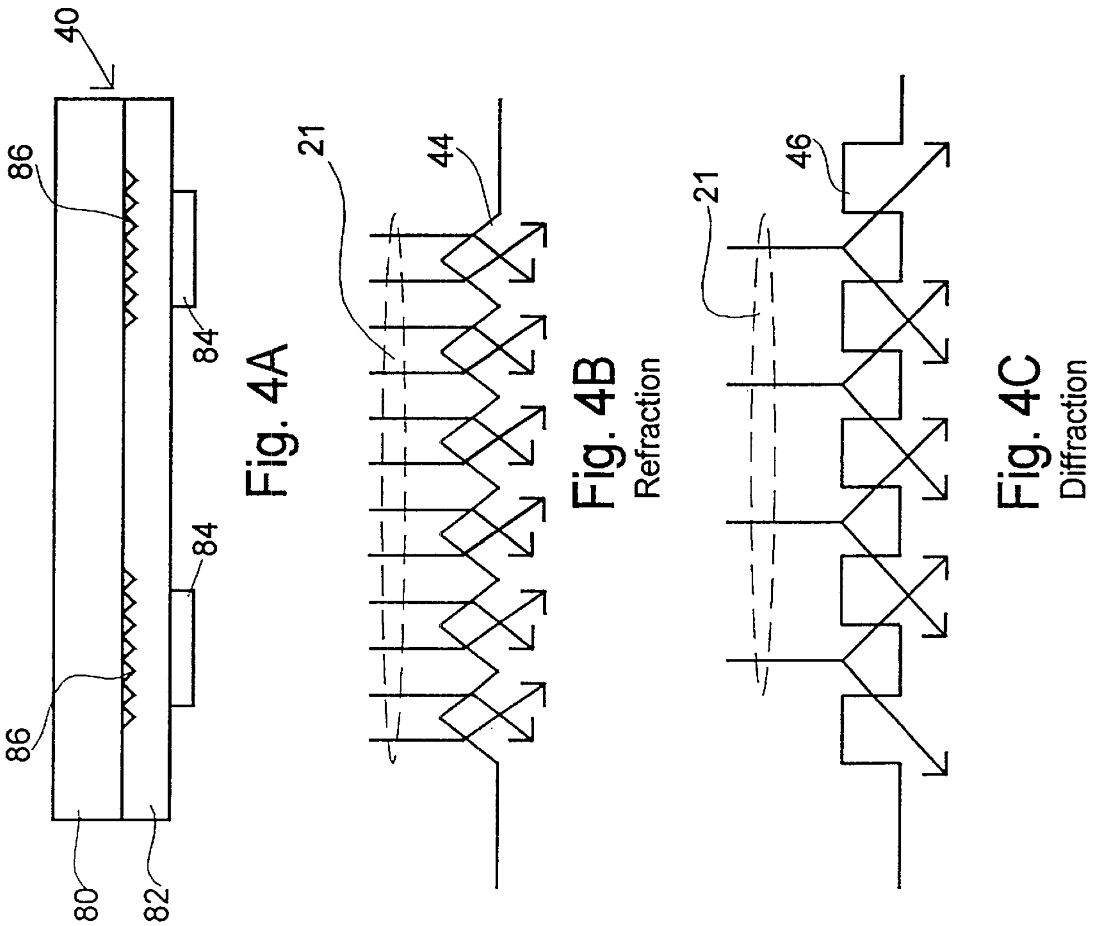
FIG. 4A illustrates a first alternative embodiment of invention for creating the ray distribution of the type shown in FIG. 2B.
FIG. 4B illustrates the operation of a refractive grating, which can be used in the first alternative embodiment of FIG. 4A.
FIG. 4C illustrates the operation of a diffractive grating, which can be used in the first alternative embodiment of FIG. 4A.

FIG. 4A illustrates another embodiment of the invention in which collimated rays having a constant illumination angle are created using a special optical redirecting mask design. The optical redirecting mask 40 has a quartz substrate 80. On the bottom surface of the quartz substrate 80 a set of optical deflectors 86 are applied. The optical deflectors can be either refractive, diffractive, or reflective. The optical deflector 86 are covered with a transparent spacer 82 of approximately 200 micrometer ($\mu$m) thickness. An opaque mask 84, preferably chromium, is applied on the spacer 82 surface to define the location and diameter of the bore of the re-entrant orifices.

FIG. 4B illustrates a first embodiment of implementing the optical deflector 86. In this first embodiment, the optical deflector 86 is achieved by using a refractive structure 44 such as a prism shape shown in cross-section. The source of illumination 21 rays entering the prism are redirected at an angle defined by the prism geometry to achieve the desired angle of incidence for the nozzle taper angle.

FIG. 4C illustrates a second embodiment of implementing the optical deflector 86. In this second embodiment, the optical deflector 86 is achieved using a diffractive pattern 46 as illustrated which has spacing that is less than one quarter of the wavelength of the source of illumination 21. The angle of the out-going electromagnetic energy from the source of illumination 21 is controlled by the diffraction grating pitch width and the reflective index difference between the quartz substrate 80 and the transparent spacer material 82.

Figure 4E:
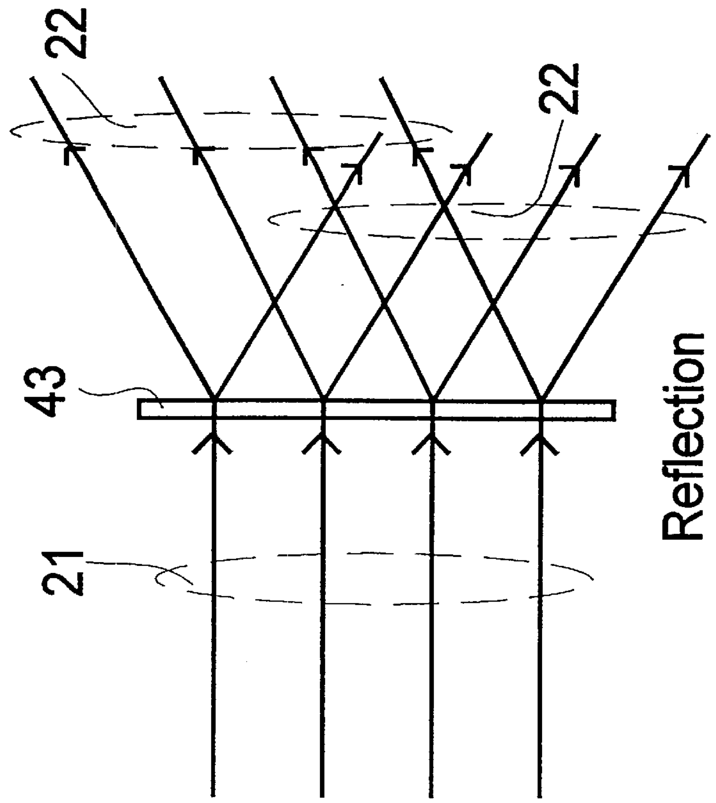
FIG. 4E illustrates the operation of the holographic grating of FIG. 4D, which can be used in the first alternative embodiment of FIG. 4A.
Figure 4D:
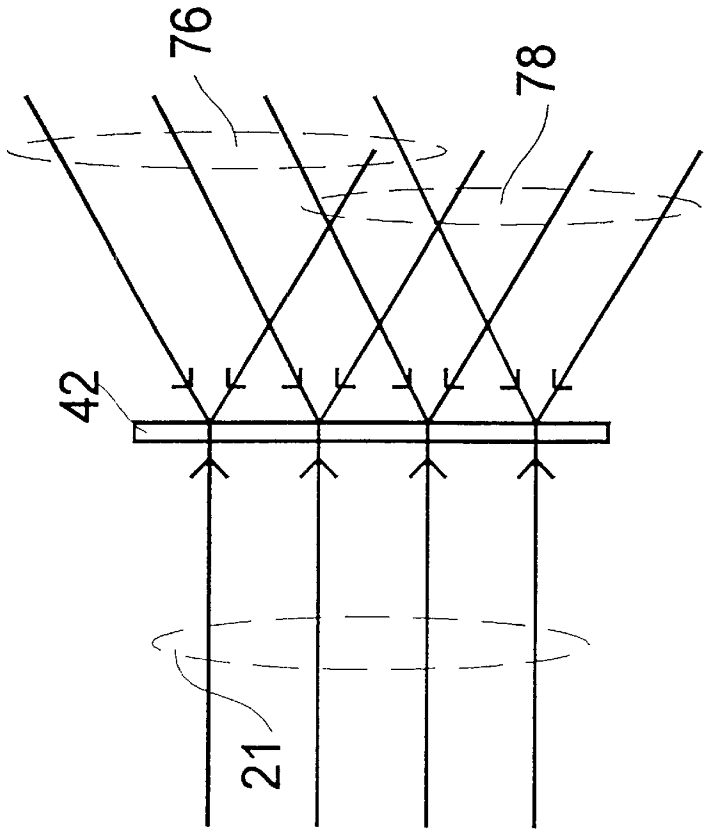
FIG. 4D illustrates a method of creating a holographic grating used in the first alternative embodiment of FIG. 4A.

FIGS. 4D and 4E illustrate how an exemplary reflective optical deflector 42 could be created to reflect the rays from the source of illumination 21 using holographic techniques. A coherent light source with three co-equal length beams is created. In FIG. 4D, a first beam of the three co-equal length beams of a coherent source of illumination 21 is projected orthogonally onto one surface of holographic film 42. A second beam, second coherent electromagnetic source 76, and a third beam, third coherent electromagnetic source 78, is then applied to the opposite side of the holographic film 42, each at the desired angle of incidence to the holographic film 42 surface. The combination of coherent electromagnetic beams superimpose on the film and expose the silver or other reflective metal particles in the holographic film 42 and record the desired angle of incidence. The holographic film 42 is then developed. In FIG. 4E, the developed holographic film 43 is targeted with the source of illumination 21 and due to the orientation of the silver particles in the developed holographic film 43, the source of illumination 21 rays are reflected as originally recorded to create the electromagnetic source 22 at the desired angle of incidence. This holographic film 43 can then be used as the optical deflector 86.

Figure 5:
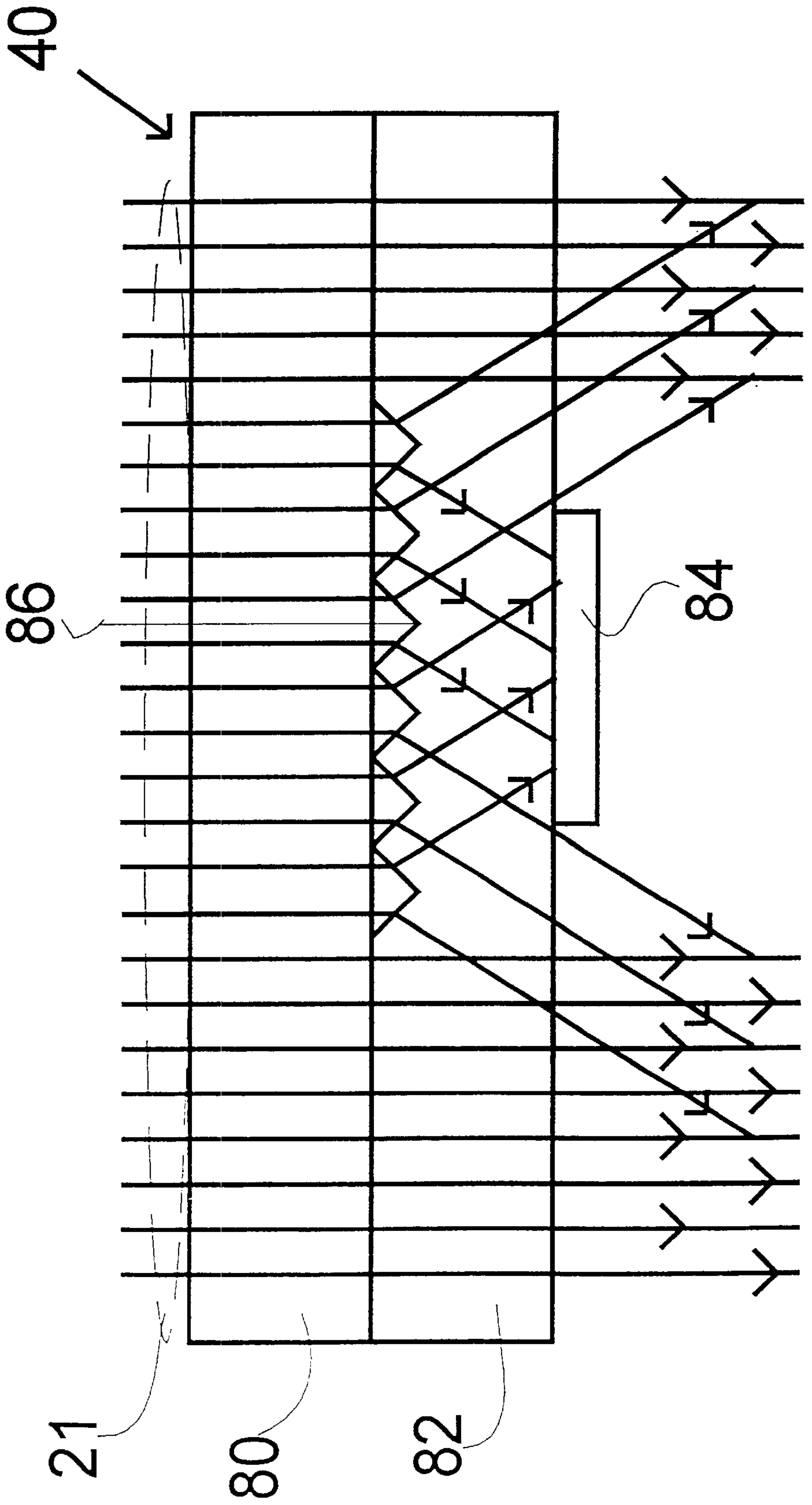
FIG. 5 illustrates the operation of the first alternative embodiment shown in FIG. 4A using the refractive grating of FIG. 4B.

FIG. 5 is an illustration showing the operation of the redirecting optical mask 40 in creating a electromagnetic source having a constant illumination angle to create re-entrant orifices arrays. The source of illumination 21 enters the redirecting optical mask 40 and either passes straight through the mask of quartz substrate 80 and transparent spacer 82 or strikes the optical deflector 86, shown in cross-section. The rays striking the optical deflector 86 are diverted in one of two directions. Those that are diffracted towards the opaque mask 84 are blocked by the opaque mask 84 from leaving the redirecting optical mask 40. The illumination leaving the mask is directed away from the opaque mask patterns allowing any photosensitive material exposed by the mask to be defined by a re-entrant profile.

Figure 6C:
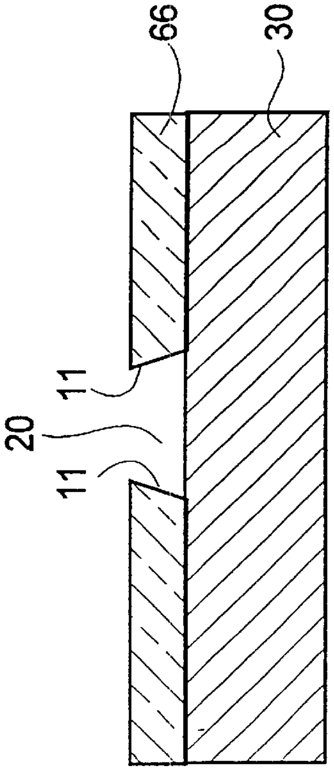
FIGS. 6A–6C illustrate the process steps used to produce a re-entrant nozzle using the first alternative embodiment of FIG. 4A.
Figure 6A:
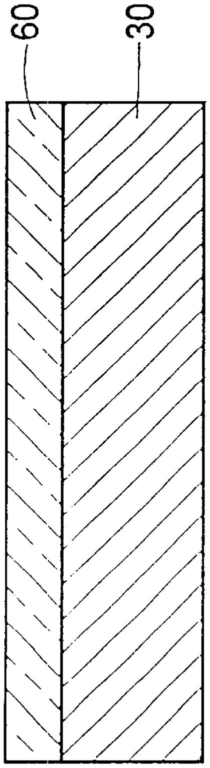
Figure 6B:
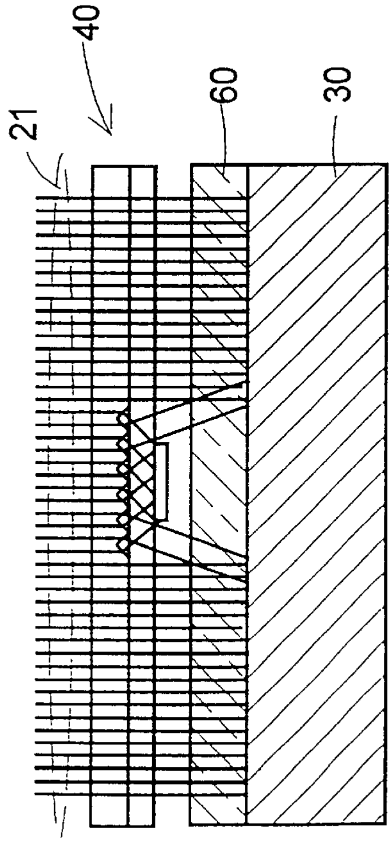

FIGS. 6A–6C illustrate a process by which a re-entrant orifice is created using the redirecting optical mask 40 of FIG. 4A. In the first step of FIG. 6A, a polymer film 60 having a negative photoactive property is applied to a substrate 30 such as a silicon or other semiconductor wafer. The thickness of the polymer film varies with the application but is typically 5 $\mu$m to 30 $\mu$m for an ink-jet orifice. The polymer film 60 can be PMMA, BCB (Dow), or SU8 (MCC, IBM) material. In FIG. 6B, the redirecting optical mask 40 is aligned over the polymer film 60 and substrate 30 and the polymer film 60 is exposed with the source of illumination 21 to pattern the polymer film 60. In FIG. 6C, the polymer film 60 has been developed and baked to create a developed polymer film 66 which now includes a re-entrant nozzle 20 having negative sidewalls 11.

Figure 7C:
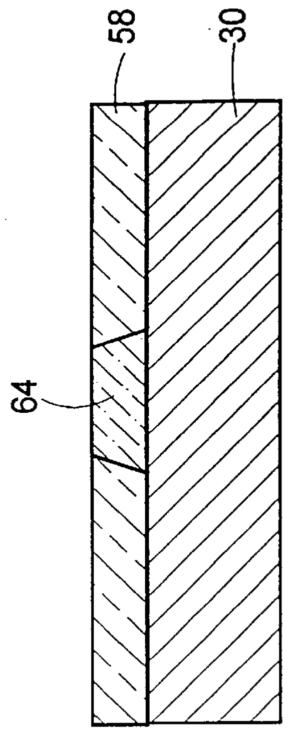
FIGS. 7A–7D illustrate the process steps to produce a re-entrant nozzle using the first embodiment of FIG. 3 using photolithography.
Figure 7D:
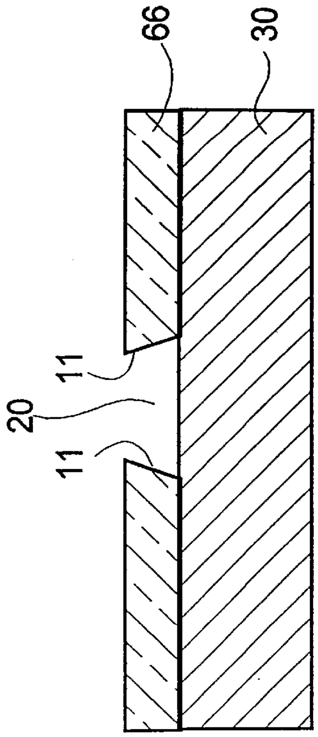
Figure 7A:
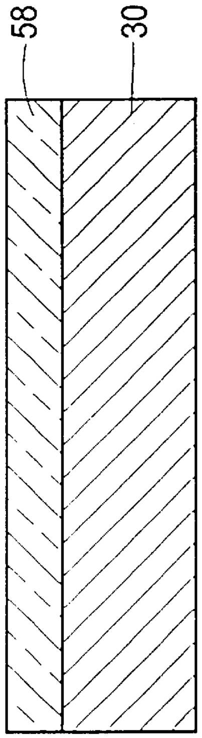
Figure 7B:
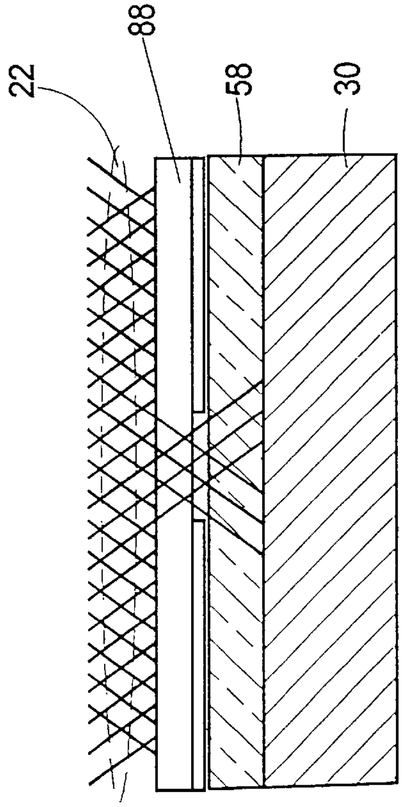

FIGS. 7A–7D illustrate the process steps to create an array of re-entrant holes, orifices, or nozzles using the afocal optical system illustrated in FIG. 3 with photolithography techniques. In FIG. 7A, a positive photoactive film 58 is deposited onto a substrate 30, which is preferably a silicon or other semiconductor wafer. In FIG. 7B, a conventional mask 88, having openings in the mask layer for locating the re-entrant orifices, is place over the substrate 30. The electromagnetic source 22 created by the afocal optical system 34 of FIG. 3 is then used to illuminate the mask. Part of the electromagnetic source 22 penetrates the mask openings to expose the positive photoactive film 58. Because the electromagnetic source 22 has its rays projected at a common angle of incidence, the re-entrant orifices are exposed in the positive photoactive film. FIG. 7C illustrates the exposed film 64 after the mask is removed. FIG. 7D illustrates the result of developing and removing the exposed film 64 to create a re-entrant nozzle 20 having the negative sidewalls 11 in the developed film 66.

Figure 8A:
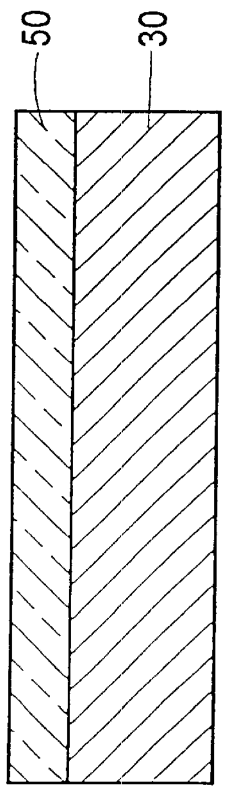
FIGS. 8A–8D illustrate alternate process steps to produce a re-entrant nozzle using the first embodiment of FIG. 3 using laser ablation.
Figure 8B:
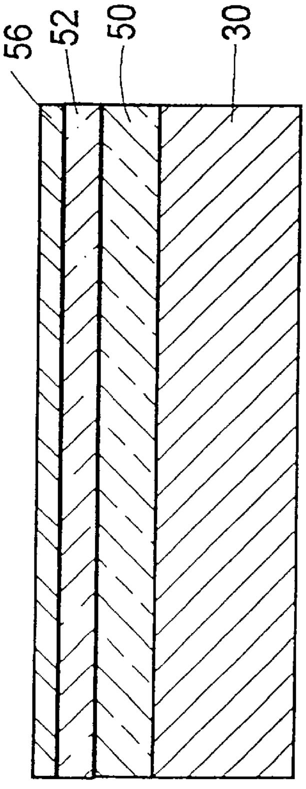
Figure 8C:
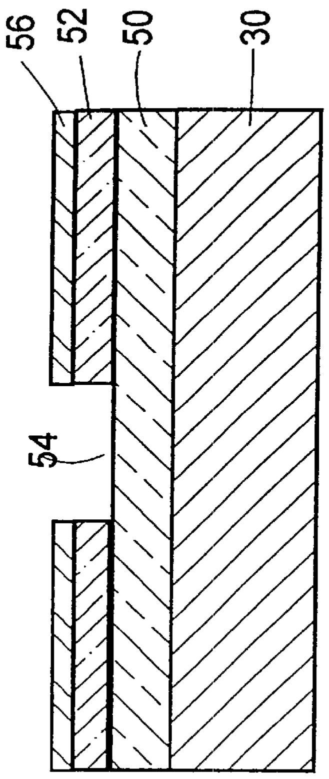
Figure 8D:
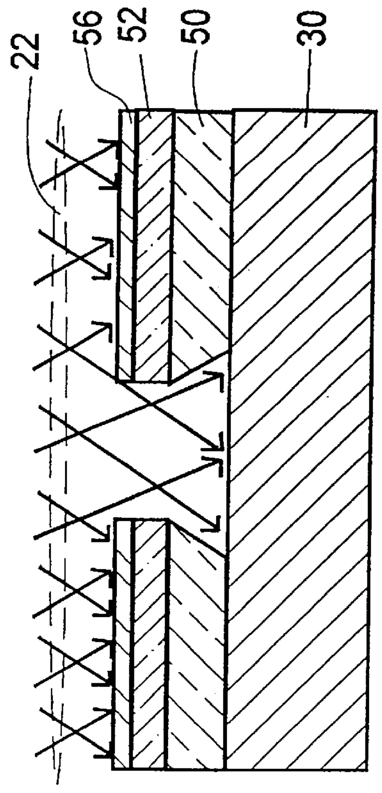

FIGS. 8A–8D illustrate an alternative re-entrant nozzle manufacturing process for creating a re-entrant nozzle array using the afocal optical system illustrated in FIG. 3. This process allows for high precision nozzles using optical ablation. The re-entrant angle of a nozzle is controlled by the selection of the numerical aperture (NA) of the afocal optical system which is related to the angle of incidence. An inexpensive electromagnetic source from a high NA optical system, such as a pulse-narrowed $CO_2$ laser or a YAG laser to name a couple, is preferably used for the radiation source. The advantage of this alternative process is that the nozzle is self-aligned and its diameter is controlled by an ablation window. FIG. 8A illustrates the first step in which a polyimide film 50 is applied to a substrate 30, which is preferably a silicon or other semiconductor substrate. The polyimide film 50 is preferably 5 um to 30 um thick. The polyimide film 50 is preferably pre-cured which allows for good dimensional stability. Using polyimide film 50 which is pre-cured, a wide spectrum of material is available in which to determine the appropriate polyimide film 50 for long-term ink resistance. Ink resistance is the ability of the polyimide film 50 to withstand the corrosive effects due to the ink's chemistry. FIG. 8B illustrates the step of depositing a thin layer of metal 52 on top of the polyimide film 50. The thickness of the thin layer of metal 52 is preferably about 1000 Angstroms to 1500 Angstroms. The thin metal layer is then coated with a thickness of silicon dioxide, $SiO_2$ to one-half the wavelength of the electromagnetic source. The thin layer of metal 52 can be either aluminum (Al) or tungsten (W). The thin layer of metal can be applied by using conventional metal sputtering processes. FIG. 8C illustrates the result of the photolithography process steps after applying a photoresist on the thin metal surface and opening the photoresist to expose an area of the thin layer of metal 52 to allow removal by etching through an ablation window 54. FIG. 8D illustrates exposing the substrate 30 and the applied layers with the ablation window 54 to the electromagnetic source 22 created by the afocal optical system of FIG. 3. This electromagnetic source from the high NA optical system ablates the polyimide film creating arrays of re-entrant orifices simultaneously.

Figure 9A:
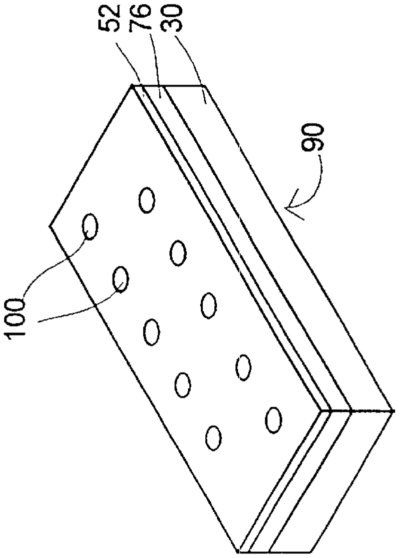
FIG. 9A illustrates a printhead using the re-entrant nozzles created from the embodiments of the invention.
Figure 9B:
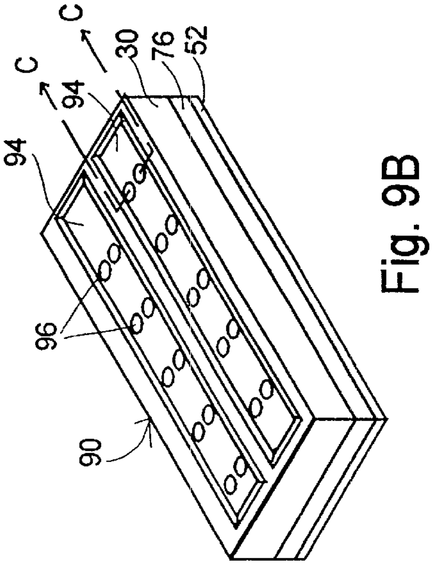
FIG. 9B illustrates the backside of the printhead of FIG. 8A showing the ink channels used to provide ink to the re-entrant nozzles on topside surface of the printhead.

FIG. 9A illustrates an exemplary printhead 90 which has at least one nozzle formed by processes used in the invention. The re-entrant nozzles 100 are shown formed in the optional thin layer of metal 52 and orifice layer 76 which reside on substrate 30. The orifice layer 76 can be either the developed photoactive film 66 shown in FIG. 6C or FIG. 7D, or the polyimide film 50 shown in FIG. 8D. FIG. 9B illustrates the backside of the exemplary printhead 90 showing the ink channels 94 and ink feed holes 96 in substrate 30.

Figure 9C:
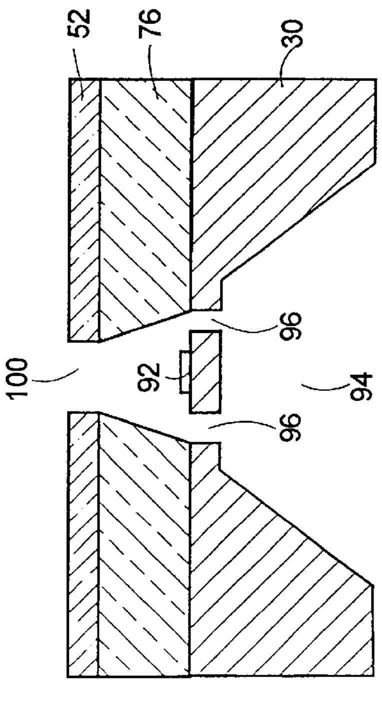
FIG. 9C illustrates a cross-section of the printhead re-entrant orifice and ejection chamber.

FIG. 9C is a cross-sectional view of the CC perspective in FIG. 9B of the exemplary printhead 90 through one of the re-entrant nozzles 100. The ink channel 94 allows ink to flow to ink feed holes 96 which further conduct the ink up into the re-entrant nozzle 100 formed in the orifice layer 76 and optionally, thin layer of metal 52. The re-entrant nozzle 100 surrounds resistor 92.

Figure 10:
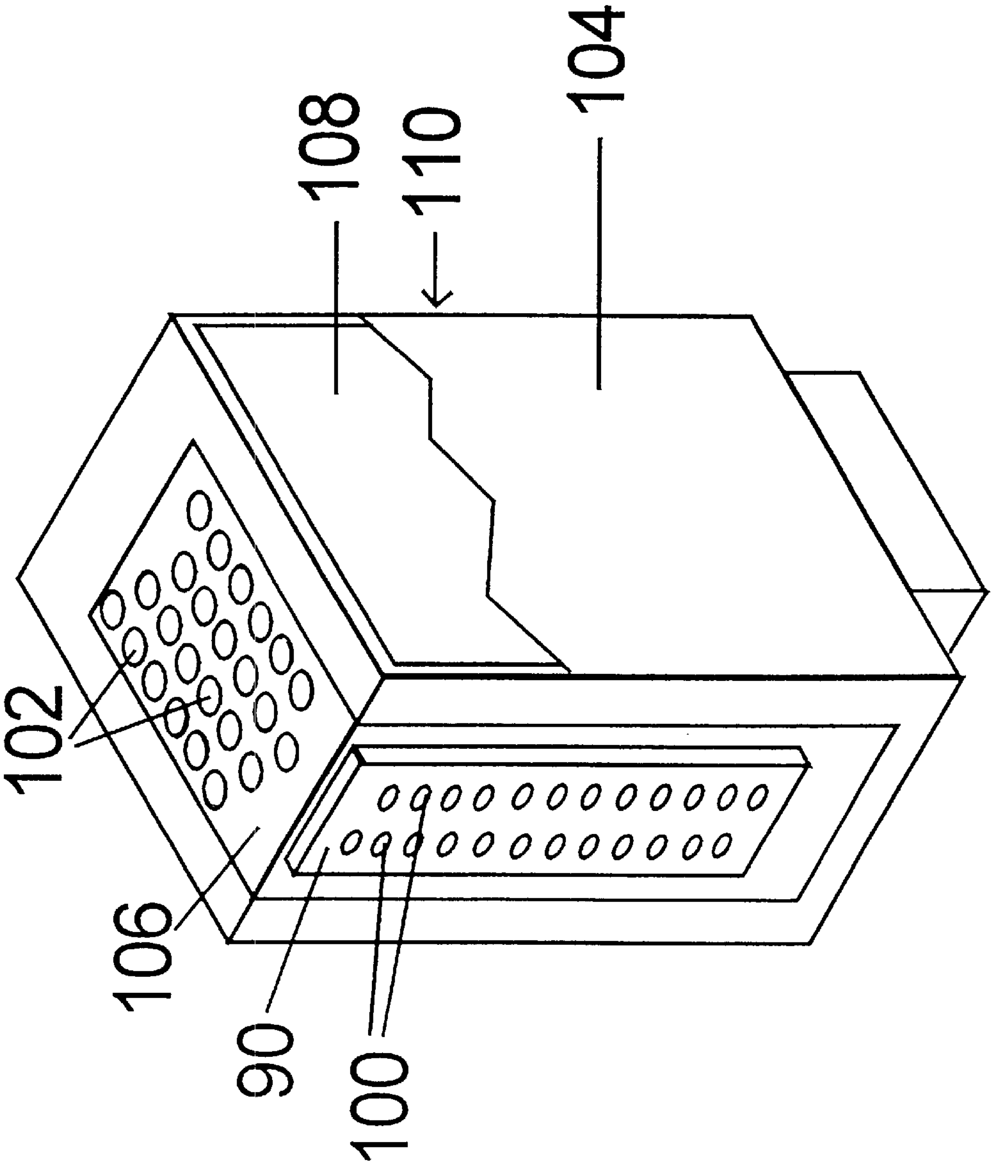
FIG. 10 illustrates an exemplary print cartridge which includes the printhead illustrated in FIG. 9A.

FIG. 10 is an isometric view of an exemplary print cartridge 110 which includes the exemplary printhead 90 of FIG. 9A. The print cartridge 110 has an ink container 104 which holds a back-pressure regulator 108, which in this embodiment is a sponge but other back-pressure regulators are known to those skilled in the art. The printhead 90 is attached to a flex circuit 106 which routes electrical signals from a host device such as a printer from contacts 102. The ink container 104 has an opening in which ink within the container is coupled to the ink channels 94 of printhead 90.

By creating a electromagnetic source having a constant illumination angle over the process plane of the optical system, repeatable, high quality, and low cost re-entrant nozzle arrays can be manufactured to allow for precise ink-jet printing.

Although specific embodiments of the invention have been described and illustrated, the invention is not limited to the specific forms or arrangements of parts so described and illustrated. For example, although the specific embodiments described herein are directed to thermal ink-jet printheads, the invention can be used with both piezoelectric and continuous flow printheads. In addition, although specific implementations of forming a electromagnetic source having a constant illumination angle were described and illustrated, those skilled in the art will appreciate that other methods can be used to create a constant illumination angle and still meet the scope and spirit of the invention.

What is claimed is:

1. A redirecting optical mask for creating re-entrant nozzles, the redirecting optical mask comprising:

a quartz substrate having a first surface;

a optical deflector disposed on said first surface;

a transparent spacer material disposed on said first surface over said optical deflector; and an opaque mask disposed on said spacer material, wherein said opaque mask defines the location and bore dimensions of the re-entrant nozzles.

2. The redirecting optical mask of claim 1, wherein said optical deflector is further comprised of a refractive structure.

3. The redirecting optical mask of claim 1, wherein said optical deflector is further comprised of a diffractive Structure.

4. The redirecting optical mask of claim 1, wherein said optical deflector is further comprised of a reflecting structure.

5. A re-entrant nozzle produced using the redirecting optical mask of claim 1.

6. An array of nozzle comprising at least one re-entrant nozzle of claim 5.

7. A printhead having ink-jet nozzles having re-entrant profiles produced using the redirecting optical mask of claim 1.

8. A print cartridge comprising the printhead of claim 7.

* * * * *